(12) United States Patent
Maede

(10) Patent No.: US 8,154,054 B2
(45) Date of Patent: Apr. 10, 2012

(54) SEMICONDUCTOR CHIP

(75) Inventor: Masato Maede, Kyoto (JP)

(73) Assignee: Panasonic Corporation, Osaka (JP)

( * ) Notice: Subject to any disclaimer, the term of this patent is extended or adjusted under 35 U.S.C. 154(b) by 17 days.

(21) Appl. No.: 12/872,678

(22) Filed: Aug. 31, 2010

(65) Prior Publication Data

US 2010/0327324 A1    Dec. 30, 2010

Related U.S. Application Data

(62) Division of application No. 12/268,904, filed on Nov. 11, 2008, now Pat. No. 7,816,708.

(30) Foreign Application Priority Data

Dec. 28, 2007 (JP) .................................. 2007-339739

(51) Int. Cl.
*H01L 27/118* (2006.01)
(52) U.S. Cl. .................................. 257/203; 257/E27.11
(58) Field of Classification Search .......................... None
See application file for complete search history.

(56) References Cited

U.S. PATENT DOCUMENTS

| | | | |
|---|---|---|---|
| 5,962,926 A | 10/1999 | Torres et al. | |
| 6,130,484 A | 10/2000 | Kameda et al. | |
| 6,291,898 B1 | 9/2001 | Yeh et al. | |
| 6,707,164 B2 | 3/2004 | Cheng et al. | |
| 6,858,945 B2 | 2/2005 | Rakshani | |
| 7,049,706 B2 | 5/2006 | Nakamura | |
| 2001/0011768 A1 | 8/2001 | Kohara et al. | |
| 2003/0075812 A1 | 4/2003 | Cheng et al. | |
| 2003/0127731 A1 | 7/2003 | Tien | |
| 2005/0087888 A1 | 4/2005 | Rosefield et al. | |
| 2005/0184403 A1 | 8/2005 | Inagawa | |
| 2006/0261496 A1 | 11/2006 | Liaw et al. | |
| 2007/0267755 A1 | 11/2007 | Vo et al. | |

FOREIGN PATENT DOCUMENTS

| | | |
|---|---|---|
| JP | 11-87399 | 7/1989 |
| JP | 2005-277392 | 10/2005 |
| JP | 2005-303279 | 10/2005 |
| JP | 2006-339335 | 12/2006 |

*Primary Examiner* — Benjamin Sandvik

(74) *Attorney, Agent, or Firm* — McDermott Will & Emery LLP

(57) ABSTRACT

In a semiconductor chip in which external connection pads are arranged in three or more rows in a staggered configuration at the peripheral portion thereof, a first pad which is arranged in the outermost row is used as a power supply pad or a ground pad for an internal core circuit. To the first pad, a second pad which is arranged in the second outermost row is connected with a metal in the same layer as a pad metal. The resistance of a power supply line to the internal core circuit has a value of the parallel resistance of a resistance from the first pad and a resistance from the second pad, which is by far lower than the resistance from the first pad. Therefore, it is possible to prevent circuit misoperation resulting from an IR drop in the power supply of the internal core circuit.

12 Claims, 12 Drawing Sheets

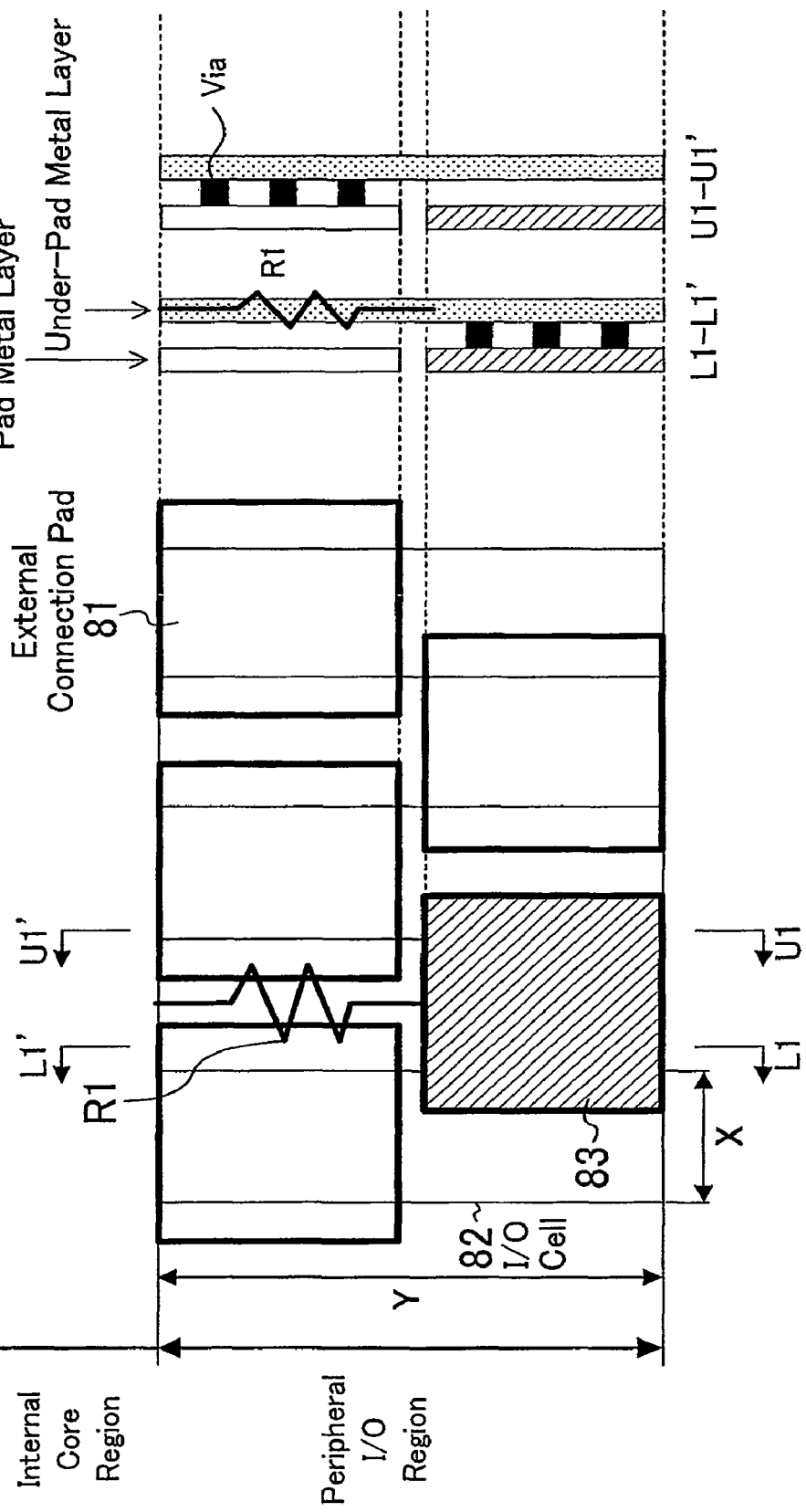

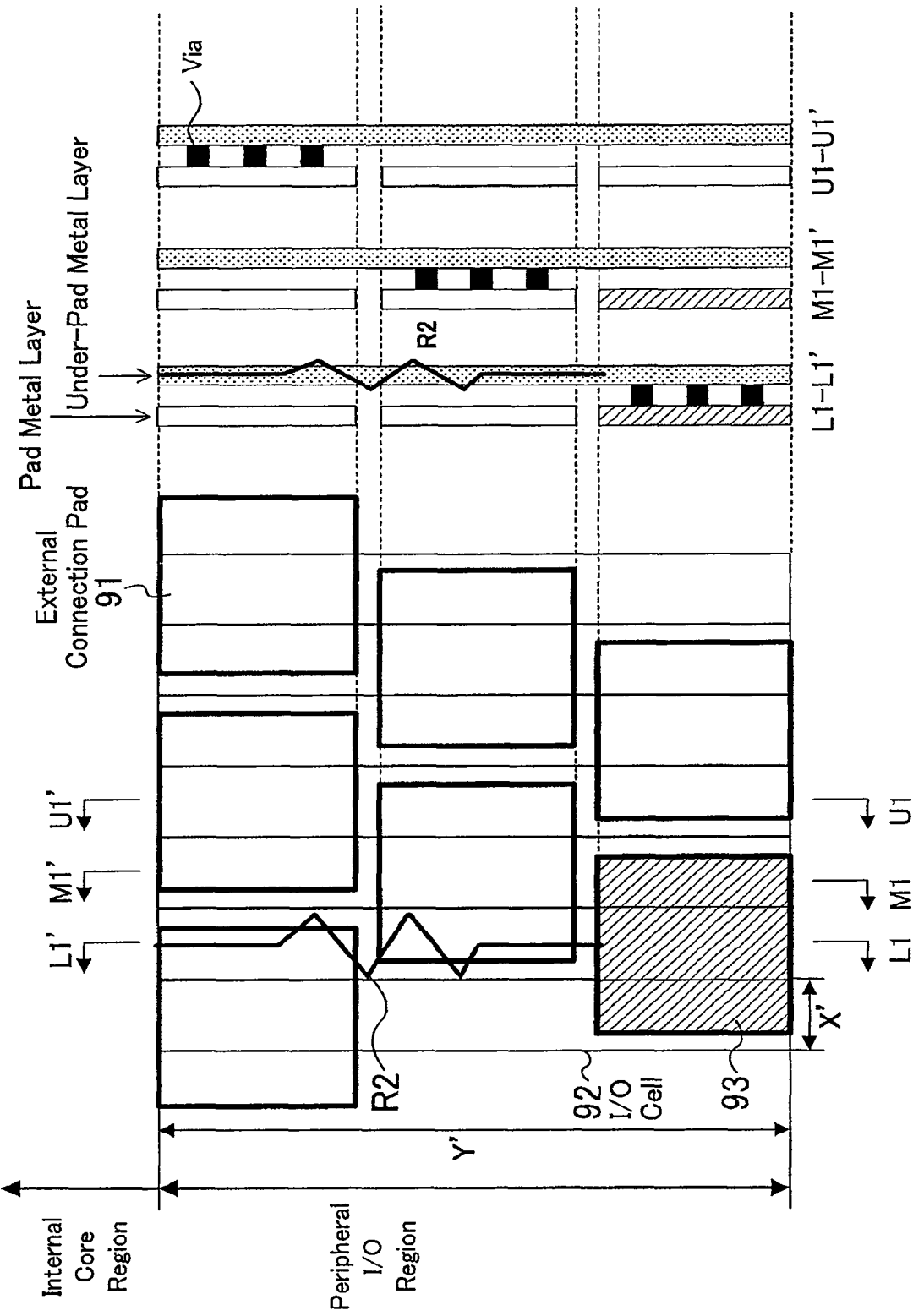

SEMICONDUCTOR CHIP

CROSS REFERENCE TO RELATED APPLICATIONS

This application is a Divisional of U.S. patent application Ser. No. 12/268,904, filed Nov. 11, 2008, now U.S. Pat. No. 7,816,708 claiming priority of Japanese Patent Application No. 2007-339739, filed Dec. 28, 2007, the entire contents of each of which are hereby incorporated by reference.

FIELD OF THE INVENTION

The present invention relates to a semiconductor chip in which external connection pads are arranged at a peripheral portion thereof.

DESCRIPTION OF THE RELATED ART

As a conventional semiconductor chip, a structure has been adopted in which an internal core region formed with an internal core circuit is provided at the center portion thereof, a peripheral I/O region formed with an interface circuit is provided outside the internal core region, and external connection pads are arranged in a staggered configuration at the peripheral portion thereof.

Patent Document 1 discloses a structure as a semiconductor chip having external connection pads arranged in two rows in a staggered configuration, in which the outer pads are used for supplying a power supply voltage or a ground voltage, and the inner pads are used for inputting/outputting signals. The arrangement prevents the intersection of bonding wires connecting the power supply pads or the ground pads and a power supply ring or a ground ring and bonding wires connecting the signal pads and inner leads, and thereby avoids wire bonding difficulty.

Patent Document 2 discloses a structure in which a plurality of I/O cells are disposed collectively as I/O cells for a power supply voltage or a ground voltage to provide compatibility between bonding easiness and stable power supply.
(Patent Document 1) Japanese Laid-Open Patent Publication No. HEI 11-87399 (page 8, FIG. 1)
(Patent Document 2) Japanese Laid-Open Patent Publication No. 2006-339335 (page 9, FIG. 1)
(Patent Document 3) Japanese Laid-Open Patent Publication No. 2005-277392 (page 11, FIG. 1)
(Patent Document 4) Japanese Laid-Open Patent Publication No. 2005-303279 (claim 17, FIG. 4)

A consideration will be given herein to a semiconductor chip in which the external connection pads are arranged in three or more rows in a staggered configuration.

In accordance with the findings from Patent Document 1, to avoid wire bonding difficulty, it is preferable to use the pads which are arranged in the outermost row as the power supply pads or the ground pads.

However, in the structure in which the pads are arranged in three or more rows, a region occupied by the pad rows is increased to increase the distance from a chip end to the internal core region. In addition, the number of I/O cells provided correspondingly to the individual pads increases to accordingly reduce the width of each of the I/O cells. Therefore, when a power supply voltage and a ground voltage are supplied from the pads in the outermost row to the internal core circuit, the resistance of a power supply line in each of the I/O cells increases to cause the probability of circuit misoperation resulting from an IR drop in the power supply of the internal core circuit.

First, a description will be given to the resistance of a power supply line in a structure in which the pads are arranged in two rows with reference to FIG. 12, of which FIG. 12A is a plan view, and FIG. 12B is a view showing the L1-L1' cross section of FIG. 12A and the U1-U1' cross section thereof. As shown in FIG. 12A, external connection pads 81 are arranged in two rows in a staggered configuration, and I/O cells 82 are arranged correspondingly to the individual external connection pads 81. Of the external connection pads 81, external connection pads 83 which are disposed in the outer row are used as power supply pads or ground pads for the internal core circuit.

It is assumed herein that the width and height of each of the I/O cells 82 are X and Y. When a power supply voltage or a ground voltage is supplied from the external connection pads 83 to the internal core circuit via the power supply line in the I/O cell 82, the resistance of the power supply line is assumed to be $R1$. The power supply line having the resistance $R1$ is formed in an under-pad metal layer, and has a length which is ½ of the distance ($=Y$) from the chip end to the internal core region. Accordingly, when it is assumed that the sheet resistance of a metal used for the power supply line is $Rs$, and the area ratio defined by the process is $A$, the following expression is satisfied:

$$R1 = 1/2 \times (Y/X) \times (Rs/A)$$
$$= 1/2 \times Z$$

where $Z=Y/X \times (Rs/A)$ is satisfied.

Next, a description will be given to the resistance of a power supply line in a structure in which the pads are arranged in three rows with reference to FIG. 13, of which FIG. 13A is a plan view, and FIG. 13B is a view showing the L1-L1' cross section of FIG. 13A, the M1-M1' cross section thereof, and the U1-U1' cross section thereof. As shown in FIG. 13A, external connection pads 91 are arranged in three rows in a staggered configuration, and I/O cells 92 are arranged correspondingly to the individual external connection pads 91. Of the external connection pads 91, external connection pads 93 which are arranged in the outermost row are used as power supply pads or ground pads for the internal core circuit.

It is assumed herein that the width and height of each of the I/O cells 92 are X' and Y'. When it is assumed that the pitch of the pad in the three row arrangement is the same (in both of the widthwise and heightwise directions of the I/O cells) as the pitch of the pads in the two-row arrangement, the pitch and height of the I/O cell in the three-row arrangement are ⅔ and 3/2 of the pitch and height of the I/O cell in the two-row arrangement. That is, the relationship given by the following expression is established:

$$X'=(\tfrac{2}{3}) \times X, Y'=(3/2) \times Y.$$

When a power supply voltage or a ground voltage is supplied from the external connection pads 93 to the internal core circuit via power supply lines in the I/O cells 92, the resistance of the power supply lines is assumed to be $R2$. The power supply line having the resistance $R2$ is formed in an under-pad metal layer, and has a length which is ⅔ of the distance ($=Y'$) from the chip end to the internal core region. Therefore, the following expression is satisfied:

$$R2 = 2/3 \times (Y'/X') \times (Rs/A)$$
$$= 2/3 \times ((3/2) \times Y/(2/3) \times X) \times (Rs/A)$$
$$= 3/2 \times Z.$$

Thus, the resistance R2 of the power supply line in the three-row arrangement is by far higher than the resistance R1 of the power supply line in the two-row arrangement. According to the calculation shown above, the resistance R2 is triple the resistance R1. When the resistance of the power supply line increases, an IR drop in the power supply of the internal core circuit increases, and the possibility of circuit misoperation resulting from the increased IR drop increases. On the other hand, in order to reduce the resistance of the power supply line in the three-row arrangement to the same level as that of the power supply line in the two-row arrangement, it is necessary to use the external connection pads the number of which is triple the number of the external connection pads in the two-row arrangement as the power supply pads or the ground pads. However, this undesirably leads to an increase in chip area.

In Patent Document 2, in order to reduce the resistance of power supply lines in I/O cells, at least three I/O cells are disposed collectively as the power supply I/O cells or the ground I/O cells, and the external connection pads for the power supply voltage or the ground voltage which correspond to the collectively disposed IO cells are arranged in the outermost row of a semiconductor chip.

However, in Patent Document 2, there is a suggestive statement that it is preferable to integrate the I/O cells the number of which is the number of pad rows plus one into a single power supply I/O cell (in the paragraph [0049]). If the suggestion is followed in the structure in which the pads are arranged in three rows, it is necessary to collectively dispose four or more I/O cells as the power supply I/O cells or the ground I/O cells. In this case, the resistance of the power supply line can conceivably be reduced, but a region used for the power supply I/O cells or the ground I/O cells becomes larger than necessary to result in an increase in the area of the semiconductor chip.

SUMMARY OF THE INVENTION

It is therefore an object of the present invention to prevent, in a semiconductor chip in which external connection pads are arranged in three or more rows in a staggered configuration at the peripheral portion thereof, circuit misoperation resulting from an IR drop in the power supply of an internal core circuit, while suppressing an increase in chip area.

An embodiment of the present invention is a semiconductor chip on which a semiconductor integrated circuit is mounted, the semiconductor chip including: an internal core region provided at a center portion of the semiconductor chip, and formed with an internal core circuit; a peripheral I/O region provided outside the internal core region, and formed with an interface circuit; and a plurality of external connection pads arranged in three or more rows in a staggered configuration at a peripheral portion of the semiconductor chip, wherein the plurality of external connection pads include: a first external connection pad which is arranged in the outermost row, and used as a power supply pad or a ground pad for the internal core circuit; and a second external connection pad which is arranged in the second outermost row, adjacent to the first external connection pad, and connected to the first external connection pad with a metal in the same layer as a pad metal.

In accordance with the present invention, the first external connection pad which is arranged in the outermost row is used as the power supply pad or the ground pad for the internal core circuit. To the first external connection pad, the second external connection pad which is arranged in the second outermost row is connected with the metal in the same layer as the pad metal. Accordingly, the resistance of a power supply line to the internal core circuit has a value of the parallel resistance of a resistance from the first external connection pad and a resistance from the second external connection pad, which is by far lower. Therefore, it is possible to prevent circuit misoperation resulting from an IR drop in the power supply of the internal core circuit. In addition, because the I/O cells corresponding to the power supply pads or the ground pads are only two, there is no increase in chip area.

Another embodiment of the present invention is a semiconductor chip on which a semiconductor integrated circuit is mounted, the semiconductor chip including: an internal core region provided at a center portion of the semiconductor chip, and formed with an internal core circuit; a peripheral I/O region provided outside the internal core region, and formed with an interface circuit; and a plurality of external connection pads arranged in three or more rows in a staggered configuration at a peripheral portion of the semiconductor chip, wherein at least one of the external connection pads which are arranged in the innermost row is used as a power supply pad or a ground pad for the internal core circuit, and at least one of the external connection pads which are arranged in the outermost row is used as a power supply pad or a ground pad for the interface circuit.

In accordance with the present invention, at least one of the external connection pads which are arranged in the innermost row is used as the power supply pad or the ground pad for the internal core circuit. This allows a reduction in the resistance of a power supply line to the internal core circuit. Therefore, it is possible to prevent circuit misoperation resulting from an IR drop in the power supply of the internal core circuit. In addition, there is no increase in chip area. Moreover, since at least one of the external connection pads which are arranged in the outermost row is used as the power supply pad or the ground pad for the interface circuit, the length of a bonding wire connecting the external connection pad and a power supply ring or a ground ring around the semiconductor chip can be reduced. As a result, the inductance of the bonding wire is reduced to allow a reduction in simultaneous-output-change noise which occurs in the power supply voltage or the ground voltage for the interface circuit due to simultaneous outputting of signals from the internal core circuit via the interface circuit. In this manner, circuit misoperation can be prevented.

Thus, the present invention allows a reduction in the resistance of each power supply line to the internal core circuit in the semiconductor chip in which the external connection pads are arranged in three or more rows in a staggered configuration at the peripheral portion thereof. Therefore, it is possible to prevent circuit misoperation resulting from an IR drop in the power supply of the internal core circuit, while suppressing an increase in chip area.

BRIEF DESCRIPTION OF THE DRAWINGS

FIG. 3 are views each partly showing a configuration of external connection pads in the semiconductor chip according to the first embodiment, of which FIG. 3A is a plan view and FIG. 3B is a cross-sectional view;

FIG. 6 are views each partly showing a configuration of the external connection pads in the semiconductor chip according to the fourth embodiment, of which

FIG. 12 are views for illustrating the resistance of a power supply line in a semiconductor chip in which pads are arranged in two rows, of which FIG. 12A is a plan view and FIG. 12B is a cross-sectional view; and FIG. 13 are views for illustrating the resistance of a power supply line in a semiconductor chip in which pads are arranged in three rows, of which FIG. 13A is a plan view and FIG. 13B is a cross-sectional view.

DETAILED DESCRIPTION OF THE PREFERRED EMBODIMENTS

Figure 1:
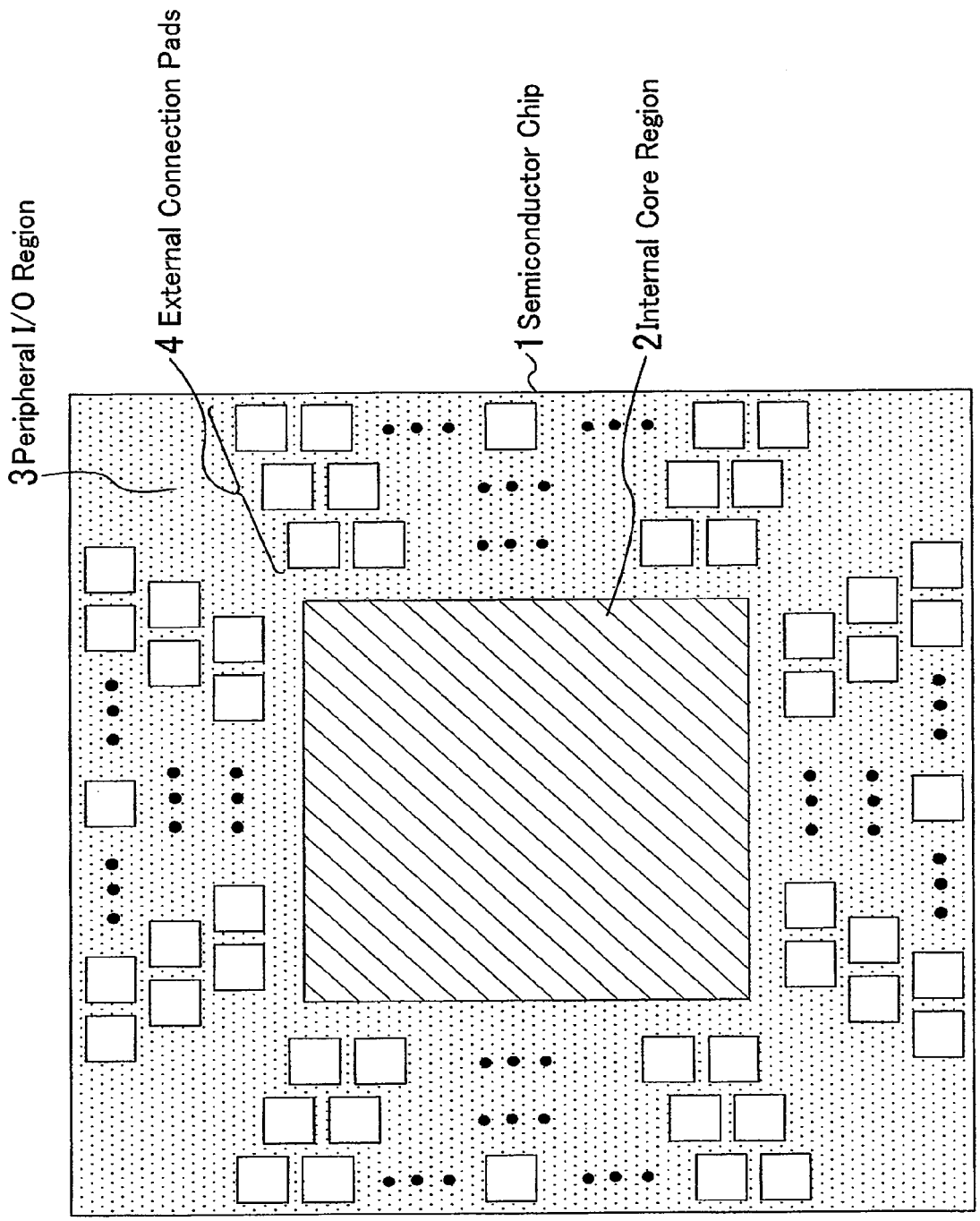
FIG. 1 is a schematic view of a structure of a semiconductor chip which is assumed in each of the first to fourth embodiments of the present invention.

Referring to the drawings, the embodiments of the present invention will be described hereinbelow in detail.

Embodiment 1

FIG. 1 is a schematic view of a structure of a semiconductor chip which is assumed in each of the first to fourth embodiments of the present invention. The semiconductor chip 1 shown in FIG. 1 includes an internal core region 2 provided at the center portion thereof, and formed with an internal core circuit, and a peripheral I/O region 3 provided outside the internal core region 2, and formed with an interface circuit (I/O circuit). At the peripheral portion of the semiconductor chip 1, a plurality of external connection pads 4 are arranged in three rows in a staggered configuration. To the external connection pads 4, I/O cells in the interface circuit are connected individually.

Figure 2:
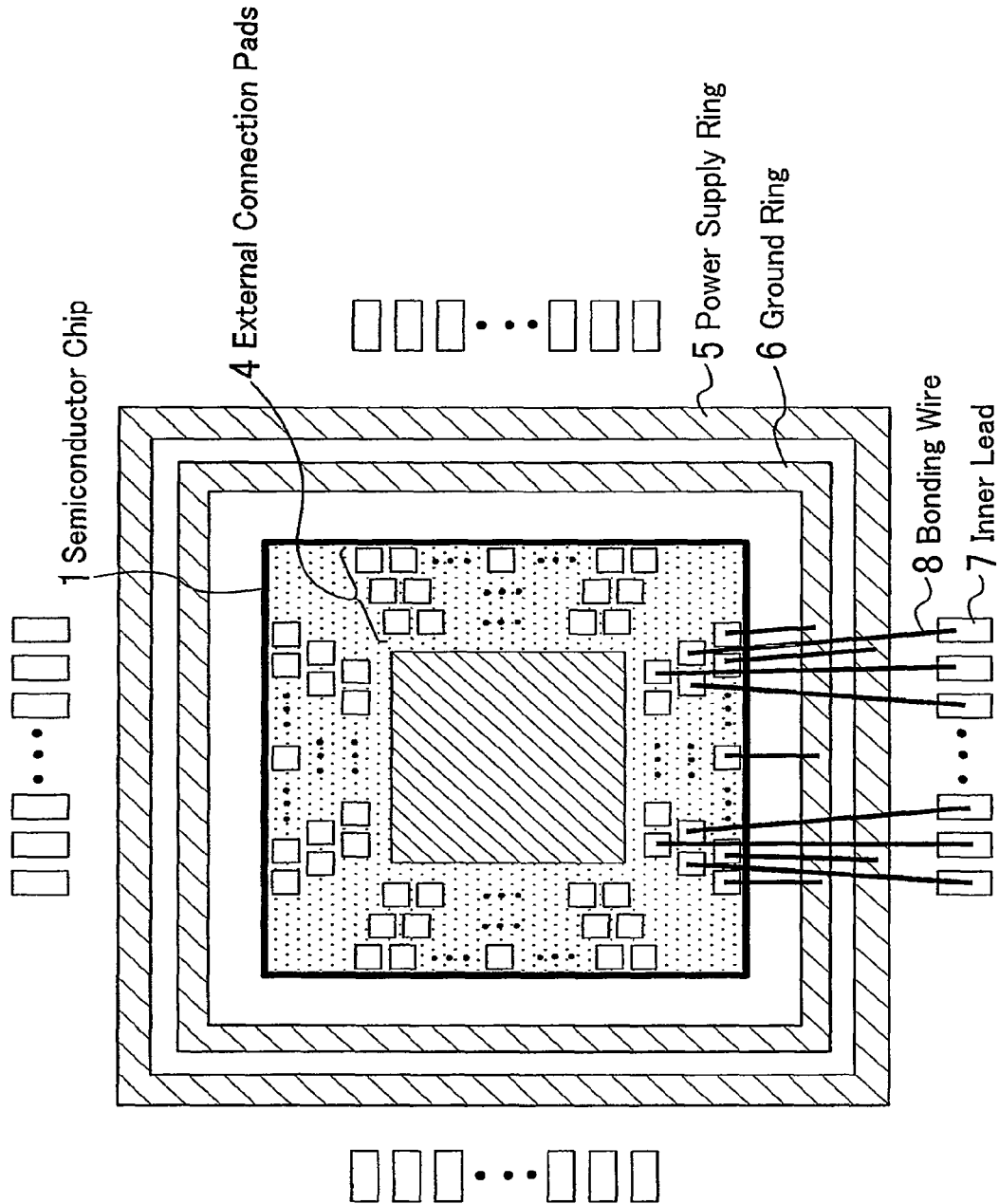
FIG. 2 is a view showing a state where the semiconductor chip of FIG. 1 is mounted on a BGA package.

FIG. 2 is a view showing a state where the semiconductor chip 1 of FIG. 1 is mounted on a BGA (Ball Grid Array) package. In the BGA package, a dedicated plane for a power supply voltage and a ground voltage is provided, and a common power supply ring 5 and a common ground ring 6 are disposed on the dedicated plane so as to surround the semiconductor chip 1. Further outside the power supply ring 5, inner leads 7 for signals are disposed. Of the external connection pads 4, those for the power supply voltage are connected to the power supply ring 5, those for the ground voltage are connected to the ground ring 6, and those for signals are connected to the inner leads 7 with individual bonding wires 8.

As described above in association with the problems, in the structure in which the external connection pads are arranged in three or more rows, the distance from the chip end to the internal core region is increased, while the width of each of the I/O cells is reduced. Accordingly, when the power supply voltage and the ground voltage are supplied from the external connection pads in the outermost row to the internal core circuit, the resistance of each of the power supply lines in the I/O cells is increased to cause the possibility of circuit misoperation resulting from an IR drop in the power supply of the internal core circuit. To cope with the problem, the present embodiment reduces the resistance of the power supply line to a sufficiently low value when the power supply voltage and the ground voltage are supplied from the external connection pads in the outermost row to the internal core circuit.

Figure 3:
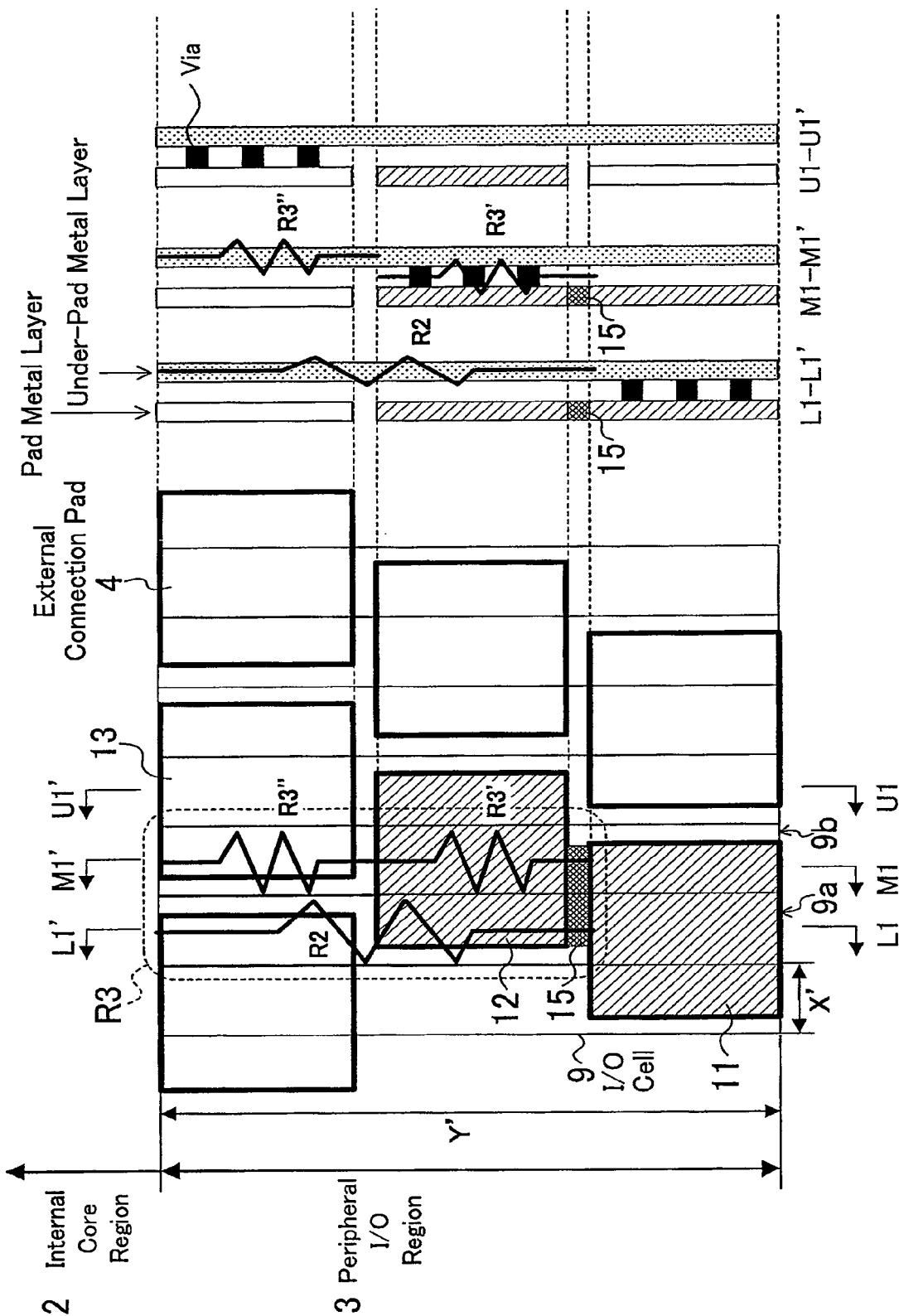

FIG. 3 are views each partly showing a configuration of external connection pads in a semiconductor chip according to the first embodiment, of which FIG. 3A is a plan view, and FIG. 3B is a view showing the L1-L1' cross section of FIG. 3A, the M1-M1' cross section thereof, and the U1-U1' cross section thereof. As shown in FIG. 3A, the external connection pads 4 are arranged in three rows in a staggered configuration, and I/O cells 9 are arranged correspondingly to the external connection pads 4. In the cross-sectional view of FIG. 3B, only two layers which are a pad metal layer and an under-pad metal layer are shown, and the depiction of metal layers and diffusion layers each underlying the under-pad metal layer is omitted.

In the present embodiment, of the plurality of external connection pads 4, the first external connection pad 11 which is arranged in the outermost row is used as a power supply pad or a ground pad for the internal core circuit, as shown in FIG. 3. The first external connection pad 11 is connected to second external connection pad 12 which is arranged in the second outermost row (which is the middle row in the present embodiment) and adjacent to the first external connection pad 11 with a metal 15 in the same layer as a pad metal. With such an arrangement, the resistance value of the power supply line is lowered, and an IR drop in the power supply of the internal core circuit is suppressed.

A description will be given herein to the effect of suppressing an IR drop in the power supply of the internal core circuit according to the present embodiment. It is assumed that the width and height of each of the I/O cells 9 are X' and Y'. When the width and height of the I/O cell when the external connection pads are arranged in two rows are assumed to be X and Y, the following expression is satisfied, as described above in association with the problems:

$$X'=(2/3)\times X, Y'=(3/2)\times Y.$$

When the power supply voltage or the ground voltage is supplied from the first and second external connection pads 11 and 12 to the internal core circuit via the power supply lines in the I/O cells 9, the resistance of the power supply line is assumed to be R3. The resistance R3 has a combined resistance value of R2 and (R3'+R3") as follows:

$$R3=R2//(R3'+R3'')$$

where R2 is the resistance of the power supply line in an I/O cell 9a including the cross section L1-L1', R3' is the resistance of the power supply line in an I/O cell 9b including the cross section M1-M1' under the second external connection pad 12, and R3" is the resistance of the power supply line in the same I/O cell 9b under the external connection pad 13 in the third row.

The power supply line having the resistance R3' is composed of two layers which are the pad metal layer and the under-pad metal layer, and has a length which is ⅓ of the distance (=Y') from the chip end to the internal core region 2. The power supply line having the resistance R3" is composed of one layer which is the under-pad metal layer, and has a length which is ⅓ of the distance Y'. Accordingly, when it is assumed that the sheet resistance of a metal (metal used in the pad metal layer and the under-pad metal layer) used for the power supply lines is Rs, and an area ratio defined by the process is A, the following expressions are satisfied:

$$R3' = 1/2 \times (1/3 \times Y'/X') \times (Rs/A)$$
$$R3'' = (1/3 \times Y'/X') \times (Rs/A)$$
$$\therefore R3' + R3'' = 1/2 \times (1/3 \times Y'/X') \times (Rs/A) + (1/3 \times Y'/X') \times (Rs/A)$$
$$= (1/2 \times (3/2) \times Y)/((2/3) \times X) \times (Rs/A)$$
$$= 9/8 \times Z$$

where Z=Y/X×(Rs/A). Therefore, the following expressions are satisfied:

$$R3 = R2 // (R3' + R'')$$
$$= (3/2 \times Z) // (9/8 \times Z)$$
$$= 9/14 \times Z,$$

which satisfies the following expressions:

$$R3/R2 = (9/14)/(3/2) = 3/7 \approx 0.42$$

$$R3/R1 = (9/14)/(1/2) = 9/7 \approx 1.28.$$

That is, the resistance R3 has a value which is about 40% of the resistance R2 when only the external connection pads in the outermost row are used as the power supply pads or the ground pads. Compared with the resistance R1 when only the external connection pads in the outer row of the two-row arrangement are used as the power supply pads or the ground pads, the resistance R3 is slightly higher than the resistance R1.

Thus, according to the present embodiment, the resistance of the power supply line can be reduced to a sufficiently low value by connecting the first external connection pad 11 which is arranged in the outermost row and the second external connection pad 12 which is arranged in the second outermost row with the metal 15 in the same layer as the pad metal, and using the first external connection pad 11 as the power supply pad or the ground pad for the internal core circuit. As a result, it is possible to prevent circuit misoperation resulting from an IR drop in the power supply of the internal core circuit. In addition, because the I/O cells corresponding to the power supply pads or the ground pads are only two, there is no increase in chip area.

Embodiment 2

Figure 4:
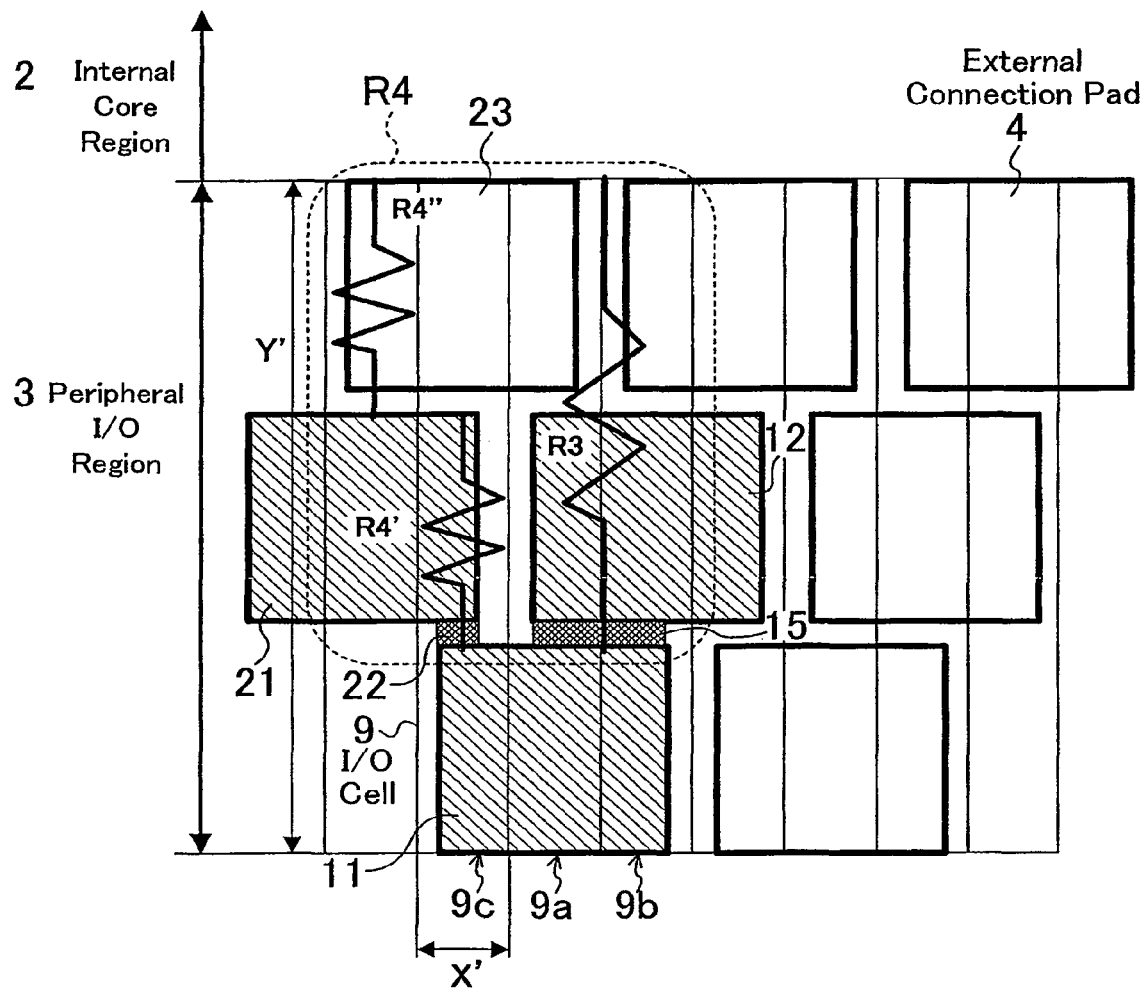
FIG. 4 is a plan view partly showing a configuration of the external connection pads in the semiconductor chip according to the second embodiment.

FIG. 4 is a plan view partly showing a configuration of the external connection pads in the semiconductor chip according to the second embodiment of the present invention. In FIG. 4 also, the external connection pads 4 are arranged in three rows in a staggered configuration, and the I/O cells 9 are arranged correspondingly to the individual external connection pads 4 in the same manner as in FIG. 3A.

In the present embodiment, of the plurality of external connection pads 4, the first external connection pad 11 which is arranged in the outermost row is used as the power supply pad or the ground pad for the internal core circuit, as shown in FIG. 4. The first external connection pad 11 is connected to the second external connection pad 12 which is arranged in the second outermost row and adjacent to the first external connection pad 11 with the metal 15 in the same layer as the pad metal. In this point, the second embodiment is the same as the first embodiment.

Further, in the present embodiment, the first external connection pad 11 is connected to a third external connection pad 21 which is arranged in the second outermost row, adjacent to the first external connection pad 11, and different from the second external connection pad 12 with a metal 22 in the same layer as the pad metal. With such an arrangement, the resistance value of the power supply line is further lowered, and an IR drop in the power supply of the internal core circuit is suppressed.

When the power supply voltage or the ground voltage is supplied from the first, second, and third external connection pads 11, 12, and 21 to the internal core circuit via the power supply lines in the I/O cells 9, the resistance of the power supply lines is assumed to be R4. The resistance R4 has a combined resistance of R3 shown in FIG. 3 and (R4'+R4") as follows:

$$R4 = R3//(R4'+R4'')$$

where R4' is the resistance of the power supply line in an I/O cell 9c corresponding to the third external connection pad 21 (in the pad metal layer), and R4" is the resistance of the power supply line in the same I/O cell 9c under the external connection pad 23 in the third row (in the under-pad metal layer). Accordingly, the resistance R4 has a value by far lower than the value of the resistance R3 in the first embodiment.

Thus, according to the present embodiment, the resistance of the power supply lines can be further reduced to a lower value by connecting the first external connection pad 11 which is arranged in the outermost row and the second and third external connection pads 12 and 21 which are arranged in the second outermost row with the metals 15 and 22 in the same layer as the pad metal, and using the first external connection pad 11 as the power supply pad or the ground pad for the internal core circuit. As a result, it is possible to prevent circuit misoperation resulting from an IR drop in the power supply of the internal core circuit. In addition, because the I/O cells corresponding to the power supply pads or the ground pads are only three, there is no increase in chip area.

Embodiment 3

Figure 5:
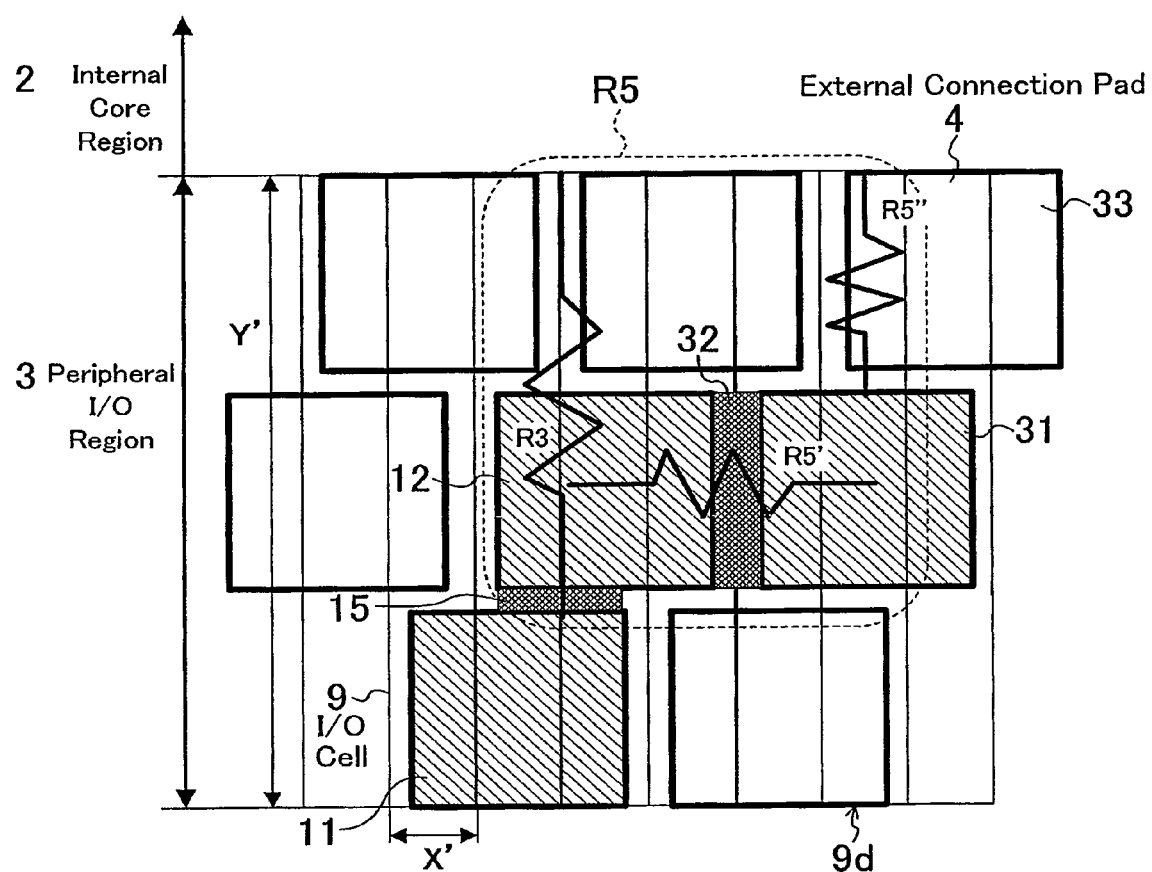
FIG. 5 is a plan view partly showing a configuration of the external connection pads in the semiconductor chip according to the third embodiment.

FIG. 5 is a plan view partly showing a configuration of the external connection pads in the semiconductor chip according to the third embodiment of the present invention. In FIG. 5 also, the external connection pads 4 are arranged in three rows in a staggered configuration, and the I/O cells 9 are arranged correspondingly to the individual external connection pads 4 in the same manner as in FIG. 3A.

In the present embodiment, of the plurality of external connection pads 4, the first external connection pad 11 which is arranged in the outermost row is used as the power supply pad or the ground pad for the internal core circuit, as shown in FIG. 5. The first external connection pad 11 is connected to the second external connection pad 12 which is arranged in the second outermost row and adjacent to the first external connection pad 11 with the metal 15 in the same layer as the pad metal. In this point, the third embodiment is the same as the first embodiment.

Further, in the present embodiment, the second external connection pad 12 is connected to a third external connection pad 31 which is arranged in the second outermost row and adjacent to the second external connection pad 12 with a metal 32 in the same layer as the pad metal. With such an arrangement, the resistance value of the power supply line is further lowered, and an IR drop in the power supply of the internal core circuit is suppressed.

When the power supply voltage or the ground voltage is supplied from the first, second, and third external connection pads 11, 12, and 31 to the internal core circuit via the power supply lines in the I/O cells 9, the resistance of the power supply lines is assumed to be R5. The resistance R5 has a combined resistance value of R3 shown in FIG. 3 and (R5'+R5") as follows:

$$R5 = R3 // (R5' + R5'')$$

where R5' is the resistance between the second external connection pad 12 and the third external connection pad 31 (in the pad metal layer), and R5" is the resistance of the power supply line in an I/O cell 9d under the external connection pad 33 (in the under-pad metal layer). Accordingly, the resistance R5 has a value by far lower than that of the resistance R3 in the first embodiment.

Thus, according to the present embodiment, the resistance of the power supply lines can be further reduced to a lower value by connecting the first external connection pad 11 which is arranged in the outermost row and the second external connection pad 12 which is arranged in the second outermost row with the metal 15 in the same layer as the pad metal, connecting the second external connection pad 12 and the third external connection pad 31 which is arranged in the second outermost row with the metal 32 in the same layer as the pad metal, and using the first external connection pad 11 as the power supply pad or the ground pad for the internal core circuit. As a result, it is possible to prevent circuit misoperation resulting from an IR drop in the power supply of the internal core circuit. In addition, because the I/O cells corresponding to the power supply pads or the ground pads are only three, there is no increase in chip area.

Embodiment 4

Figures 6A, 6B:
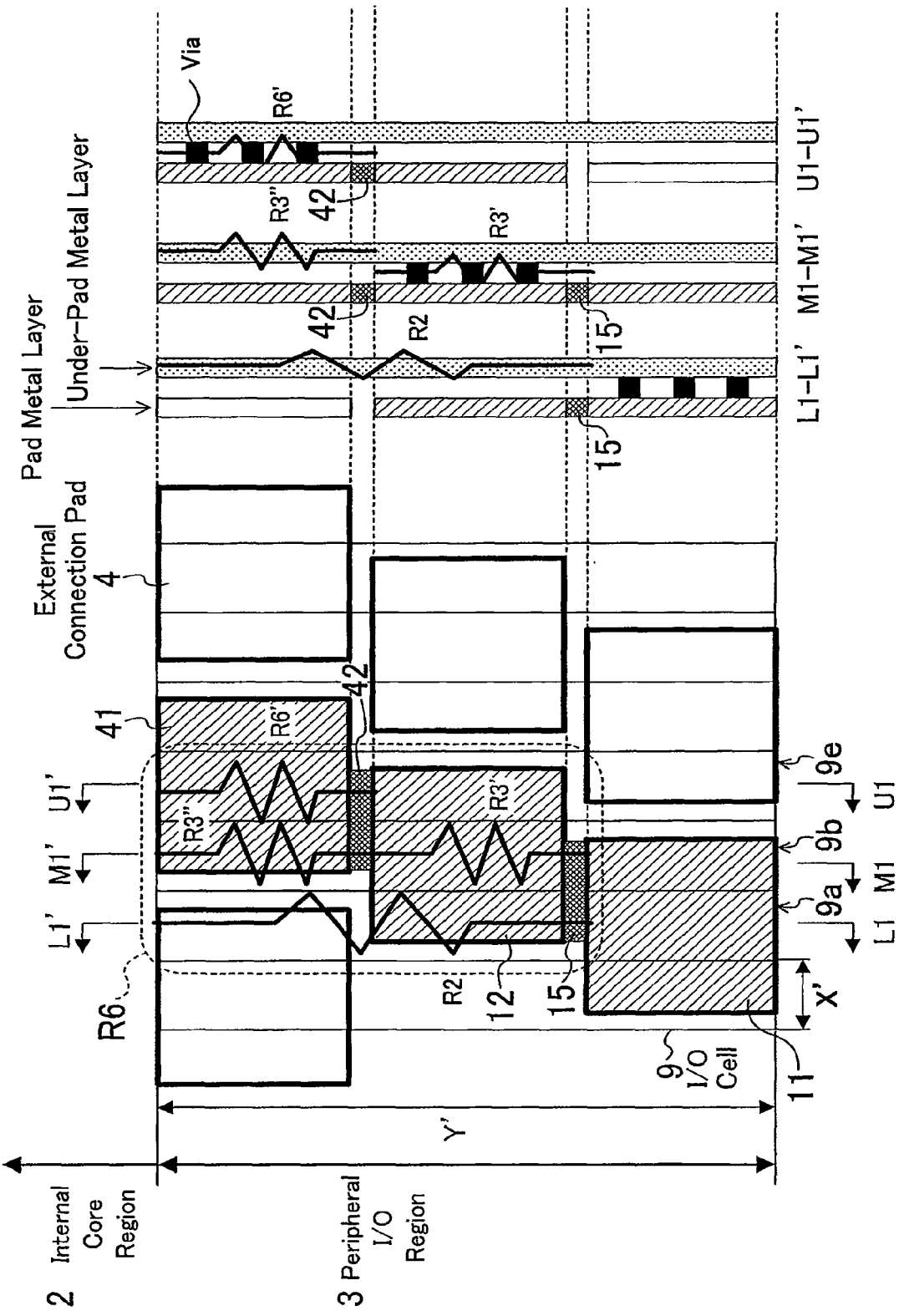
FIG. 6A is a plan view and FIG. 6B is a cross-sectional view.

FIG. 6 are views each partly showing a configuration of the external connection pads in the semiconductor chip according to the fourth embodiment of the present invention, of which FIG. 6A is a plan view and FIG. 6B is a view showing the L1-L1' cross section of FIG. 6A, the M1-M1' cross section thereof, and the U1-U1' cross section thereof. As shown in FIG. 6A, the external connection pads 4 are arranged in three rows in a staggered configuration, and the I/O cells 9 are arranged correspondingly to the individual external connection pads 4. In the cross-sectional view of FIG. 6B, only two layers which are the pad metal layer and the under-pad metal layer are shown, and the depiction of metal layers and diffusion layers each underlying the under-pad metal layer is omitted.

In the present embodiment, of the plurality of external connection pads 4, the first external connection pad 11 which is arranged in the outermost row is used as the power supply pad or the ground pad for the internal core circuit, as shown in FIG. 6. The first external connection pad 11 is connected to the second external connection pad 12 which is arranged in the second outermost row and adjacent to the first external connection pad 11 with the metal 15 in the same layer as the pad metal. In this point, the fourth embodiment is the same as the first embodiment.

In the present embodiment, the second external connection pad 12 is connected to a third external connection pad 41 which is arranged in the third outermost row (which is the innermost row in the present embodiment) and adjacent to the second external connection pad 12 with a metal 42 in the same layer as the pad metal. With such an arrangement, the resistance value of the power supply line is further lowered, and an IR drop in the power supply of the internal core circuit is suppressed.

When the power supply voltage or the ground voltage is supplied from the first, second, and third external connection pads 11, 12, and 41 to the internal core circuit via the power supply lines in the I/O cells 9, the resistance of the power supply lines is assumed to be R6. The resistance R6 has a combined resistance value of R3 shown in FIG. 3 and R6' as follows:

$$R4 = R3 // R6'$$

where R6' is the resistance of the power supply line in an I/O cell 9e including the cross section U1-U1'.

The power supply line having the resistance R6' is composed of two layers which are the pad metal layer and the under-pad metal layer, and has a length which is ⅓ of the distance (=Y') from the chip end to the internal core region 2.

Therefore, the following expression is satisfied:

$$\begin{aligned} R6' &= 1/2 \times (1/3 \times Y'/X') \times (Rs/A) \\ &= (1/6 \times (3/2) \times Y) / ((2/3) \times X) \times (Rs/A) \\ &= 3/8 \times Z, \end{aligned}$$

which satisfies the following expression:

$$\begin{aligned} R6 &= R3 // R6' \\ &= (9/14 \times Z) // (3/8 \times Z) \\ &= 9/38 \times Z. \end{aligned}$$

That is, the resistance R6 is by far lower than the resistance R3. In addition, the following expressions are satisfied:

$$R6/R2 = (9/38)/(3/2) = 3/19 \approx 0.16$$

$$R6/R1 = (9/38)/(1/2) = 9/19 \approx 0.47.$$

That is, the resistance R6 has a value which is about 10% of the resistance R2 when only the external connection pads in the outermost row are used as the power supply pads or the ground pads. Compared with the resistance R1 when only the external connection pads in the outer row in the two-row arrangement are used as the power supply pads or the ground pads, the resistance R6 is sufficiently low.

Thus, according to the present embodiment, the resistance of the power supply lines can be further reduced to a lower value by connecting the first external connection pad 11 which is arranged in the outermost row and the second external connection pad 12 which is arranged in the second outermost row with the metal 15 in the same layer as the pad metal, connecting the second external connection pad 12 and the third external connection pad 41 which is arranged in the third outermost row with the metal 42 in the same layer as the pad metal, and using the first external connection pad 11 as the power supply pad or the ground pad for the internal core circuit. As a result, it is possible to prevent circuit misoperation resulting from an IR drop in the power supply of the internal core circuit. In addition, because the I/O cells corresponding to the power supply pads or the ground pads are only three, there is no increase in chip area.

In each of the first to fourth embodiments shown above, the description has been given on the assumption that the pad metal is composed of a single layer. However, the pads may also be formed of two or more metal layers. In this case, when the individual pads are mutually connected with the metal, either all or any of the metal layers may be used appropriately.

Figure 7:
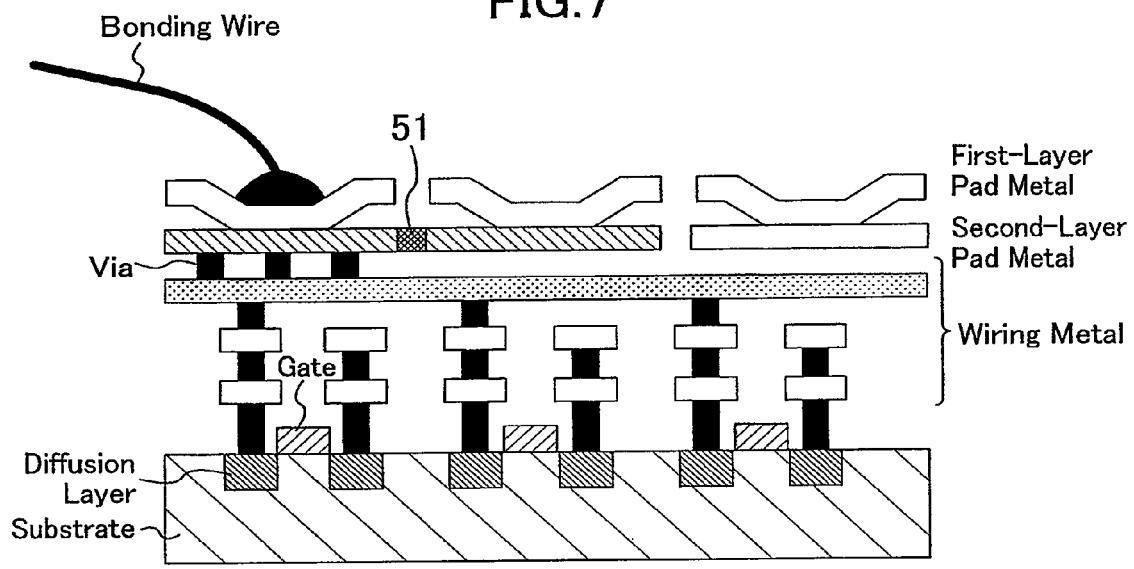
FIG. 7 is a cross-sectional view showing a state where pads each formed of a double-layer metal layer are connected with a metal in the second layer.
Figure 8:
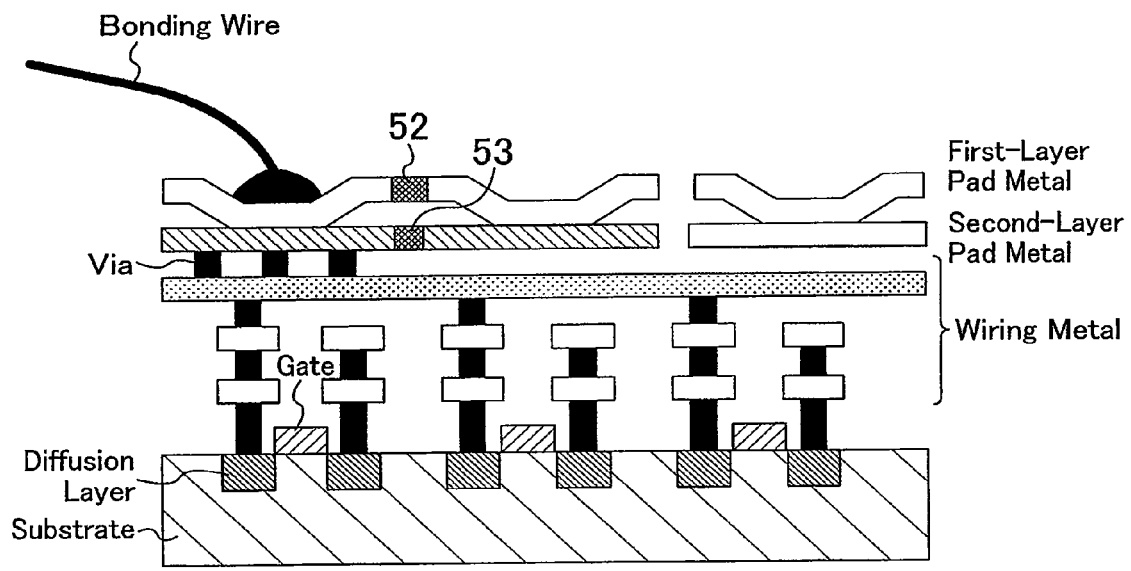
FIG. 8 is a cross-sectional view showing a state where the pads each formed of the double-layer metal layer is connected with a metal in the first layer and the metal in the second layer.
Figure 9:
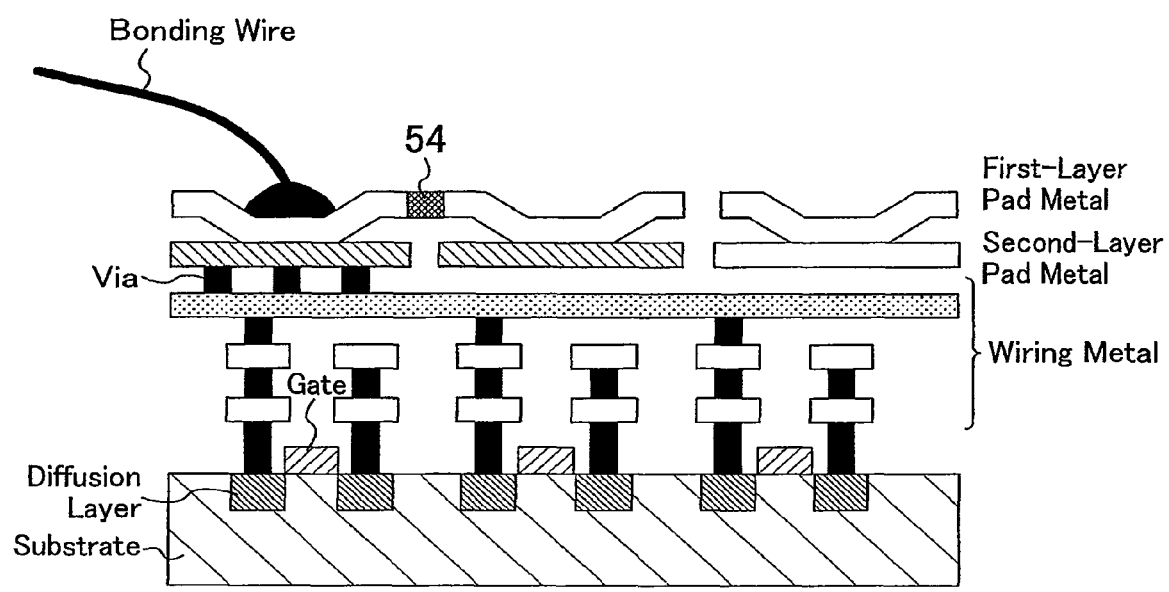
FIG. 9 is a cross-sectional view showing a state where the pads each formed of the double-layer metal layer is connected with the metal in the first layer.

FIGS. 7 to 9 are cross-sectional views showing a state where the pads formed of two metal layers are connected with the metal. FIG. 7 shows a state where the individual pads are mutually connected with a metal 51 in the same layer as a second-layer pad metal. FIG. 8 shows a state where the individual pads are mutually connected with a metal 52 in the same layer as the first-layer pad metal, and with a metal 53 in the same layer as the second-layer pad metal. FIG. 9 shows a state where the individual pads are mutually connected with a metal 54 in the same layer as a first-layer pad metal.

Embodiment 5

Figure 10:
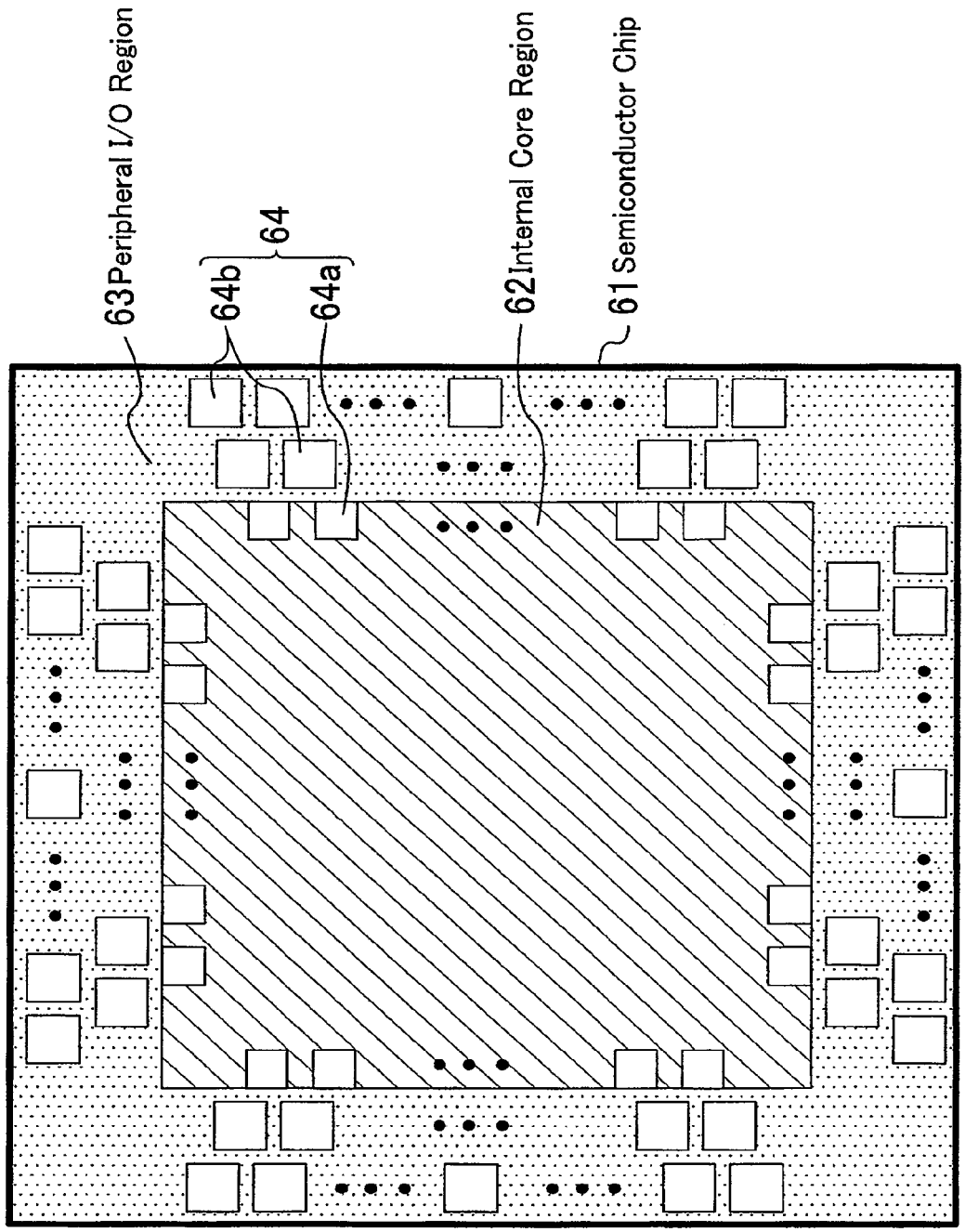
FIG. 10 is a schematic view of a structure of a semiconductor chip according to the fifth embodiment.

FIG. 10 is a schematic view of a structure of a semiconductor chip according to the fifth embodiment of the present invention. The first to fourth embodiments described above are also applicable to a semiconductor chip as shown in FIG. 10.

The semiconductor chip 61 shown in FIG. 10 includes an internal core region 62 provided at the center portion thereof, and formed with an internal core circuit, and a peripheral I/O region 63 provided outside the internal core region 62, and formed with an interface circuit. At the peripheral portion of the semiconductor chip 61, a plurality of external connection pads 64 are arranged in three rows in a staggered configuration. To the external connection pads 64, I/O cells in the interface circuit are connected individually.

Of the external connection pads 64, each of the external connection pads 64a which are arranged in the innermost row is smaller in size than each of the external connection pads 64b which are arranged in the outermost row and the second outermost row. The external connection pads 64b which are arranged in the outermost row and the second outermost row are shared pads for wire bonding and a probe test. On the other hand, the external connection pads 64a which are arranged in the innermost row are dedicated pads for wire bonding. The internal core region 62 extends to a portion located under each of the external connection pads 64a which are arranged in the innermost row, and the internal core circuit is disposed in a layer under the external connection pads 64a.

In general, the characteristics (saturation current and threshold voltage) of a transistor disposed under a pad are changed by stresses during bonding and a probe test. It is known that characteristic changes caused by the stress during bonding are smaller than characteristic changes caused by the stress during a probe test. Accordingly, it follows that only an element that can withstand the characteristic changes caused by each of the stresses can be disposed under the pad.

The internal core circuit is susceptible to the influence of the characteristic changes of the transistor. Therefore, the internal core circuit which cannot withstand the characteristic changes caused by the stress during a probe test, but can withstand the characteristic changes caused by the stress during bonding is disposed under each of the external connection pads 64a in the innermost row. Then, the external connection pads 64a in the innermost row are used as the dedicated pads for wire bonding. On the other hand, the interface circuit which is immune to the influence of the characteristic changes of the transistor is disposed under each of the external connection pads 64b in the outermost row and the second outermost row. Then, the external connection pads 64b in the outermost row and the second outermost row are used as the shared pads for wire bonding and a probe test.

To the shared pads for wire bonding and a probe test, a probe is applied during an inspection, and then wire bonding is performed during the assembly of a package. When wire bonding is performed onto a probe mark, connection is not provided successfully so that it is typically necessary to displace the position of wire bonding from that of a probe on a pad. However, because a probe test need not be performed with respect to the dedicated pads for wire bonding, the size of each of the pads can be accordingly reduced.

In the structure of FIG. 10, since the internal core circuit is disposed also in the layer under the external connection pads in the innermost row, the chip area can be accordingly reduced by the area occupied by the external connection pads in the innermost row. In addition, the distance from each of the external connection pads in the outermost row to the internal core region is reduced (to the same degree as in the two-row arrangement), and the resistance of each of the power supply lines in the I/O cells can be reduced (R=1). Therefore, when the external connection pads in the outermost row are used as power supply pads or ground pads for the internal core circuit, an IR drop in power supply is suppressed. This allows a reduction in the number of the power supply pads or the ground pads adopting a structure as shown in any of the first to fourth embodiments. As a result, the chip area can be reduced.

Embodiment 6

In each of the first to fourth embodiments described above, the external connection pads in the outermost row are used as the power supply pads or the ground pads for the internal core circuit and, to reduce the resistance of each of the power supply lines to a low value at that time, other external connection pads which are arranged in a row inner than the outermost row are connected thereto. However, to further suppress the resistance of the power supply line, it is preferable to use a larger number of the external connection pads in the innermost row as the power supply pads or the ground pads.

Figure 11:
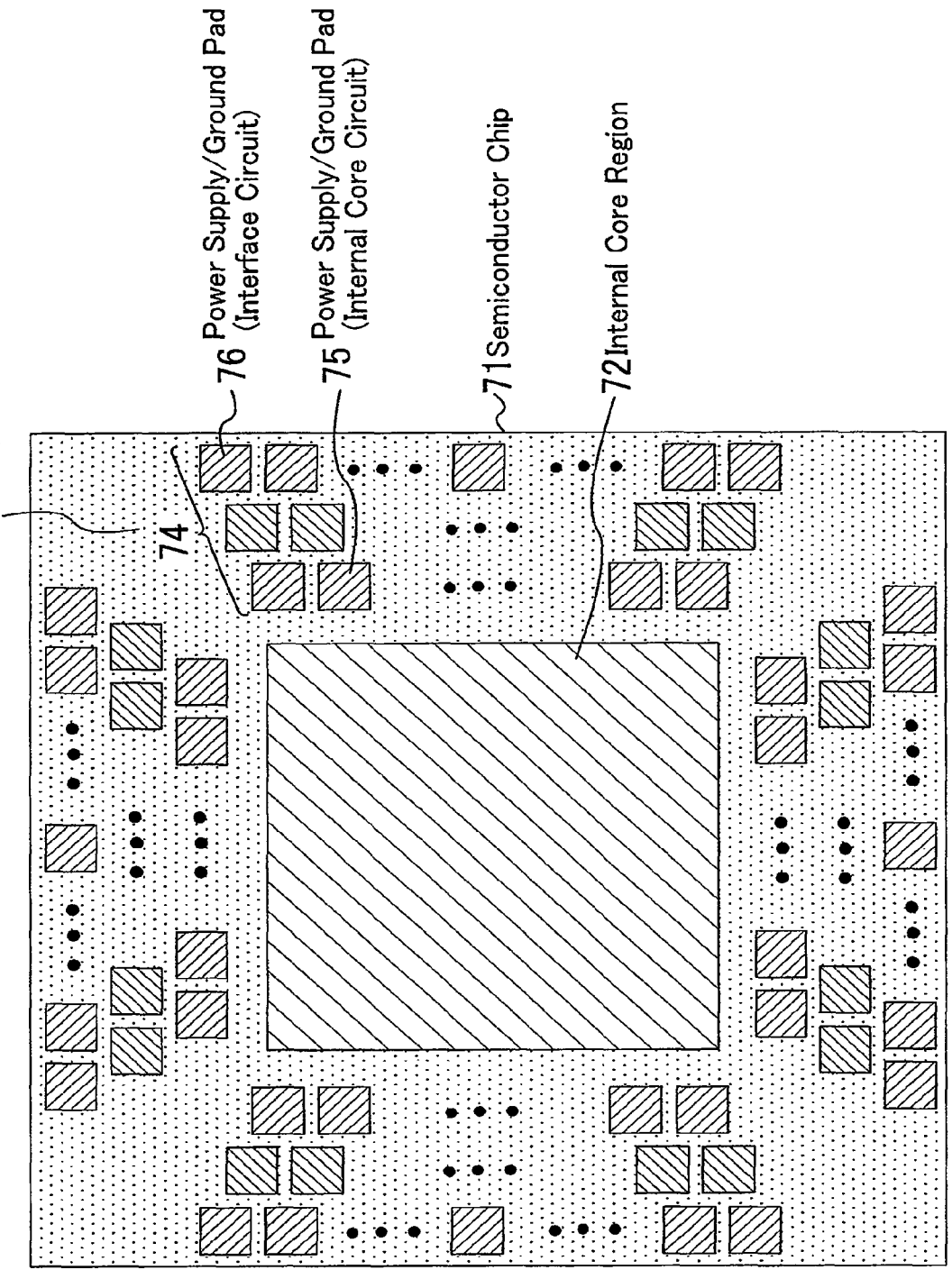
FIG. 11 is a schematic view of a structure of a semiconductor chip according to the sixth embodiment.

FIG. 11 is a schematic view of a structure of a semiconductor chip according to the sixth embodiment of the present invention. The semiconductor chip 71 shown in FIG. 11 includes an internal core region 72 provided at the center portion thereof, and formed with an internal core circuit, and a peripheral I/O region 73 provided outside the internal core region 72, and formed with an interface circuit. In the peripheral portion of the semiconductor chip 71, a plurality of external connection pads 74 are arranged in three rows in a staggered configuration. To the external connection pads 74, I/O cells in the interface circuit are connected individually.

In addition, the power supply pads or the ground pads are selectively disposed at different positions depending on whether they are for the internal core circuit or the interface circuit. That is, the external connection pads in the innermost row, e.g., external connection pads 75 are used as the power supply pads or the ground pads for the internal core circuit, while the external connection pads in the outermost row, e.g., external connection pads 76 are used as the power supply pads or the ground pads for the interface circuit. It is sufficient if at least one of the external connection pads which are arranged in the innermost row is used as the power supply pad or the ground pad for the internal core circuit, and at least one of the external connection pads which are arranged in the outermost row is used as the power supply pad or the ground pad for the interface circuit. However, it is preferable that all of the external connection pads which are arranged in the innermost row are used as the power supply pads or the ground pads for the internal core circuit, or all of the power supply pads or the ground pads for the interface circuit are the external connection pads which are arranged in the outermost row.

When a power supply voltage or a ground voltage is supplied from the external connection pads which are arranged in the innermost row to the internal core circuit, the resistance of each of the power supply lines in the I/O cells is extremely reduced (which is substantially zero, and sufficiently lower than the resistance R1 of each of the power supply lines from the external connection pads in a two-row arrangement). Therefore, by using the external connection pads in the innermost row as the power supply pads or the ground pads for the internal core circuit, it is possible to prevent circuit misoperation resulting from an IR drop in the power supply of the internal core circuit.

On the other hand, when the power supply voltage or the ground voltage is supplied from the external connection pads which are arranged in the outermost row to the interface circuit, the length of a bonding wire connecting one of the external connection pads and a power supply ring or a ground ring around the semiconductor chip can be reduced. As a result, the inductance of the bonding wire is reduced to allow a reduction in simultaneous-output-change noise which occurs in the power supply voltage or the ground voltage for the interface circuit due to simultaneous outputting of signals from the internal core circuit via the interface circuit. In this manner, circuit misoperation can be prevented. It is to be noted that the magnitude of the simultaneous-output-change noise is represented by the product of the inductance of the power supply voltage or the ground voltage and the gradient of the current waveform of the power supply voltage or the ground voltage.

That is, in the three-row staggered arrangement of the pads, the power supply pads and the ground pads are selectively disposed at different positions depending on whether they are for the internal core circuit or the interface circuit. This allows stable supply of the power supply voltage or the ground voltage, while reducing the chip area.

Because bonding wires connected to the power supply pads or the ground pads intersect bonding wires connected to signal pads, there may be the case where only the external connection pads in the innermost row are insufficient to cover all the power supply pads or the ground pads for the internal core circuit. Therefore, it is preferable that the present embodiment is implemented in combination with the first to fourth embodiments. That is, in addition to the external connection pads in the innermost row, the external connection pads in the outermost row which are connected to other external connection pads with a pad metal may be used appropriately as the power supply pads or the ground pads for the internal core circuit. It will be easily appreciated that the present embodiment may also be implemented alone, not in combination with the first to fourth embodiment.

In each of the embodiments described above, a metal for forming the external connection pads is typically Cu or Al, but may be any other kind of metal.

In each of the embodiments described above, it is assumed that the semiconductor chip is mounted on a BGA package. However, the semiconductor chip may also be mounted on another package other than the BGA package.

In each of the embodiments described above, it is assumed that the external connection pads are arranged in three rows around the semiconductor chip. However, the present invention can be similarly implemented even in a structure in which the external connection pads are arranged in four or more rows. That is, in a structure in which the external connection pads are arranged in four or more rows, it is appropriate to connect the external connection pads which are arranged in the outermost row and the external connection pads which are arranged in the second outermost row in each of the first to third embodiments. In the fourth embodiment, it is appropriate to connect the external connection pads which are arranged in the outermost row, the external connection pads which are arranged in the second outermost row, and the external connection pads which are arranged in the third outermost row. In the fifth embodiment, it is sufficient if the external connection pads which are arranged in the innermost row are dedicated pads for wire bonding, and the external connection pads which are arranged in the outermost row and the second outermost row are shared pads for wire bonding and a probe test. In the sixth embodiment, it is sufficient if the external connection pads which are arranged in the innermost row are used as the power supply pads or the ground pads for the internal core circuit, and the external connection pads which are arranged in the outermost row are used as the power supply pads or the ground pads for the interface circuit.

In accordance with the present invention, it is possible to prevent, in a semiconductor chip in which external connection pads are arranged in three or more rows in a staggered configuration at the peripheral portion thereof, circuit misoperation resulting from an IR drop in the power supply of an internal core circuit, while suppressing an increase in chip area. Therefore, the present invention is useful in, e.g., reducing the area of a semiconductor chip.

What is claimed is:

1. A semiconductor chip on which a semiconductor integrated circuit is mounted, the semiconductor chip comprising:
   an internal core region provided at a center portion of the semiconductor chip, and formed with an internal core circuit;
   a peripheral I/O region provided outside the internal core region, and formed with an interface circuit; and
   a plurality of external connection pads arranged in three or more rows in a staggered configuration at a peripheral portion of the semiconductor chip,
   wherein
   the interface circuit includes a plurality of I/O cells arranged in a first direction in which the external connection pads in any of the three or more rows are arranged,
   the plurality of external connection pads include:
   a first external connection pad which is arranged in the outermost row, and used as a power supply pad or a ground pad for the internal core circuit; and
   a second external connection pad which is arranged in the second outermost row, adjacent to the first external connection pad, and connected to the first external connection pad with a metal in the same layer as a pad metal,
   the first external connection pad and the second external connection pad fail to overlap in a second direction which is perpendicular to the first direction, and the metal extends in the second direction, the first external connection pad overlaps in the first direction with each of three I/O cells of the plurality of I/O cells and entirely overlaps in the second direction with the plurality of I/O cells, and the second external connection pad overlaps in the first direction with each of three I/O cells of the plurality of I/O cells and entirely overlaps in the second direction with the plurality of I/O cells, and the first I/O cell and the second I/O cell are adjacent to each other in the first direction.

2. The semiconductor chip of claim 1, wherein the plurality of external connection pads further include:
a third external connection pad which is arranged in the second outermost row, adjacent to the first external connection pad, and connected to the first external connection pad with a metal in the same layer as the pad metal.

3. The semiconductor chip of claim 1, wherein the plurality of external connection pads further include:
a third external connection pad which is arranged in the second outermost row, adjacent to the second external connection pad, and connected to the second external connection pad with a metal in the same layer as the pad metal.

4. The semiconductor chip of claim 1, wherein the plurality of external connection pads further include:
a third external connection pad which is arranged in the third outermost row, adjacent to the second external connection pad, and connected to the second external connection pad with a metal in the same layer as the pad metal.

5. The semiconductor chip of claim 1, wherein each of the external connection pads which are arranged in the innermost row is smaller in size than each of the external connection pads which are arranged in the outermost row and the second outermost row.

6. The semiconductor chip of claim 5, wherein the external connection pads which are arranged in the outermost row and the second outermost row are shared pads for wire bonding and a probe test.

7. The semiconductor chip of claim 6, wherein the external connection pads which are arranged in the innermost row are dedicated pads for wire bonding, and the internal core circuit is disposed in a layer under the external connection pads in the innermost row.

8. The semiconductor chip of claim 1, wherein
at least one of the external connection pads which are arranged in the innermost row is used as a power supply pad or a ground pad for the internal core circuit, and at least one of the external connection pads which are arranged in the outermost row is used as a power supply pad or a ground pad for the interface circuit.

9. The semiconductor chip of claim 8, wherein all of the external connection pads which are arranged in the innermost row are used as the power supply pads or the ground pads for the internal core circuit.

10. The semiconductor chip of claim 8, wherein all of the power supply pads or the ground pads for the interface circuit are the external connection pads which are arranged in the outermost row.

11. The semiconductor chip of claim 1, wherein a metal for forming the external connection pads is Cu or Al.

12. The semiconductor chip of claim 1, which is mounted on a BGA package.

* * * * *